United States Patent [19]

Sampsell

[11] Patent Number: 5,179,274
[45] Date of Patent: Jan. 12, 1993

[54] METHOD FOR CONTROLLING OPERATION OF OPTICAL SYSTEMS AND DEVICES

[75] Inventor: Jeffrey B. Sampsell, Plano, Tex.

[73] Assignee: Texas Instruments Incorporated, Dallas, Tex.

[21] Appl. No.: 728,925

[22] Filed: Jul. 12, 1991

[51] Int. Cl.⁵ .............................................. G01J 1/44
[52] U.S. Cl. .................................. 250/208.2; 250/205
[58] Field of Search ................ 250/213 A, 205, 208.2, 250/214 DC, 214 AL

[56] References Cited

U.S. PATENT DOCUMENTS

| | | | |
|---|---|---|---|
| 4,663,521 | 5/1987 | Maile | 250/214 AL |
| 4,960,988 | 10/1990 | Simms | 250/214 AL |
| 5,055,668 | 10/1991 | French | 250/213 A |

*Primary Examiner*—Carolyn E. Fields
*Attorney, Agent, or Firm*—Julie L. Reed; James C. Kesterson; Richard L. Donaldson

[57] ABSTRACT

The invention described herein details a method to control the operating window of illumination for an optical device or system. By connecting together two light sensitive devices (46a and 46b), one very sensitive to light (46a), the other mildly sensitive to light (46b), it is possible to designate when essential signals (38) are allowed to pass to a device or system. The outputs of the two devices are fed through logic circuitry (52 and 54) which determines the output. The logic circuitry is selected dependent upon which operation window is chosen. The output of the logic is then connected to the control signal.

7 Claims, 2 Drawing Sheets

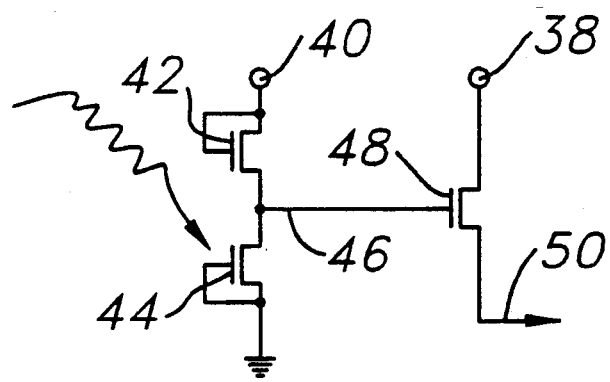
Fig. 2
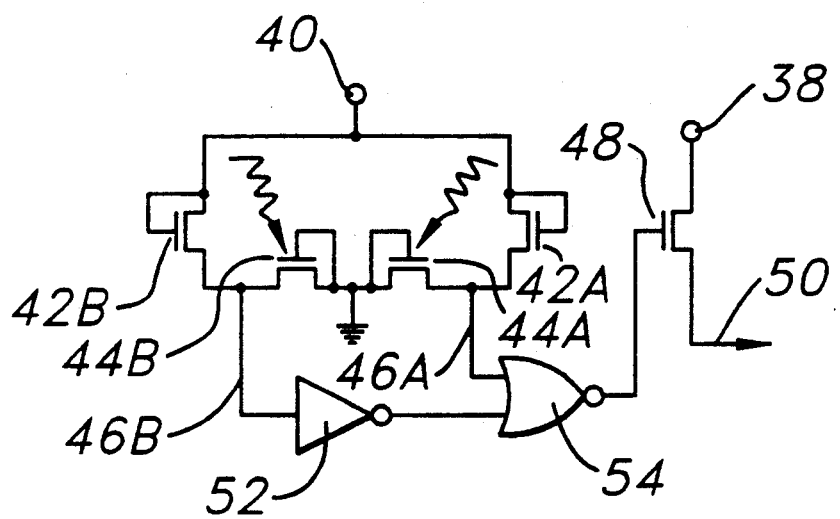
Fig. 3A
| LIGHT | 46B | 46A | $\overline{46B}$ | OUTPUT |
|---|---|---|---|---|
| DARK | 1 | 1 | 0 | NO CLOCK |
| LOW | 1 | 0 | 0 | CLOCK |
| HIGH | 0 | 0 | 1 | NO CLOCK |
Fig. 3B

METHOD FOR CONTROLLING OPERATION OF OPTICAL SYSTEMS AND DEVICES

BACKGROUND OF THE INVENTION

1. Field of the Invention

This invention relates to optical systems, more specifically, a method to control operation of these systems, or devices within them.

2. Background of the Invention

To be able to control at what levels of light optical systems operate is desirable for many reasons. Two of these reasons are to prevent pirating of devices, and to save wear and tear on the system.

A manufacturer may produce an optical system that has three different markets, depending on the size of the system. For example, in displays, three possible markets could be commercial projection systems, large screen televisions (greater that thirty inches) and smaller screen televisions. The same devices, optical memories, spatial light modulators or other light sensitive devices could be used in each. Nothing would prevent a person from buying the smaller, less expensive television and pirating the parts to make a large screen television, or a projection system.

The common element in the systems is the use of light. But each level of system, in either size or complexity, requires a different level of light. The large projection system may require high levels of illumination and the television a much lower level. It would benefit the manufacturer to be able to limit the devices in each system to a certain window of illumination that the system can operate at.

Another important reason to control the operation would be to prevent damage to the parts of a system. If a system only works efficiently at a certain level of illumination, it only causes needless wear to operate the system at a level where it operates inefficiently. Further, individual devices may be damaged at very high levels of illumination. If there were a problem in the system, where too much light was impinging upon the device, the device should be able to be shut down to prevent damage.

SUMMARY OF THE INVENTION

Objects and advantages will be obvious, and will in part appear hereinafter and will be accomplished by the present invention which provides a method and circuit to control the operating illumination window of an optical circuit.

The method comprises connecting two light sensitive elements together, one very sensitive to light, the other mildly sensitive to light. The two device outputs are then passed into a logic circuit that determines the appropriate output for the operating window chosen. This output is then connected to a system control signal, allowing the signal to pass to the system when operation is desired, and not allowing it to pass when operation is not desired.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 shows a device for controlling operation of a signal.

FIG. 3a shows an alternate device for controlling operation of a signal.

FIG. 3b shows a logic table for the device shown in FIG. 3a.

DETAILED DESCRIPTION OF THE PREFERRED EMBODIMENTS

Figure 1:
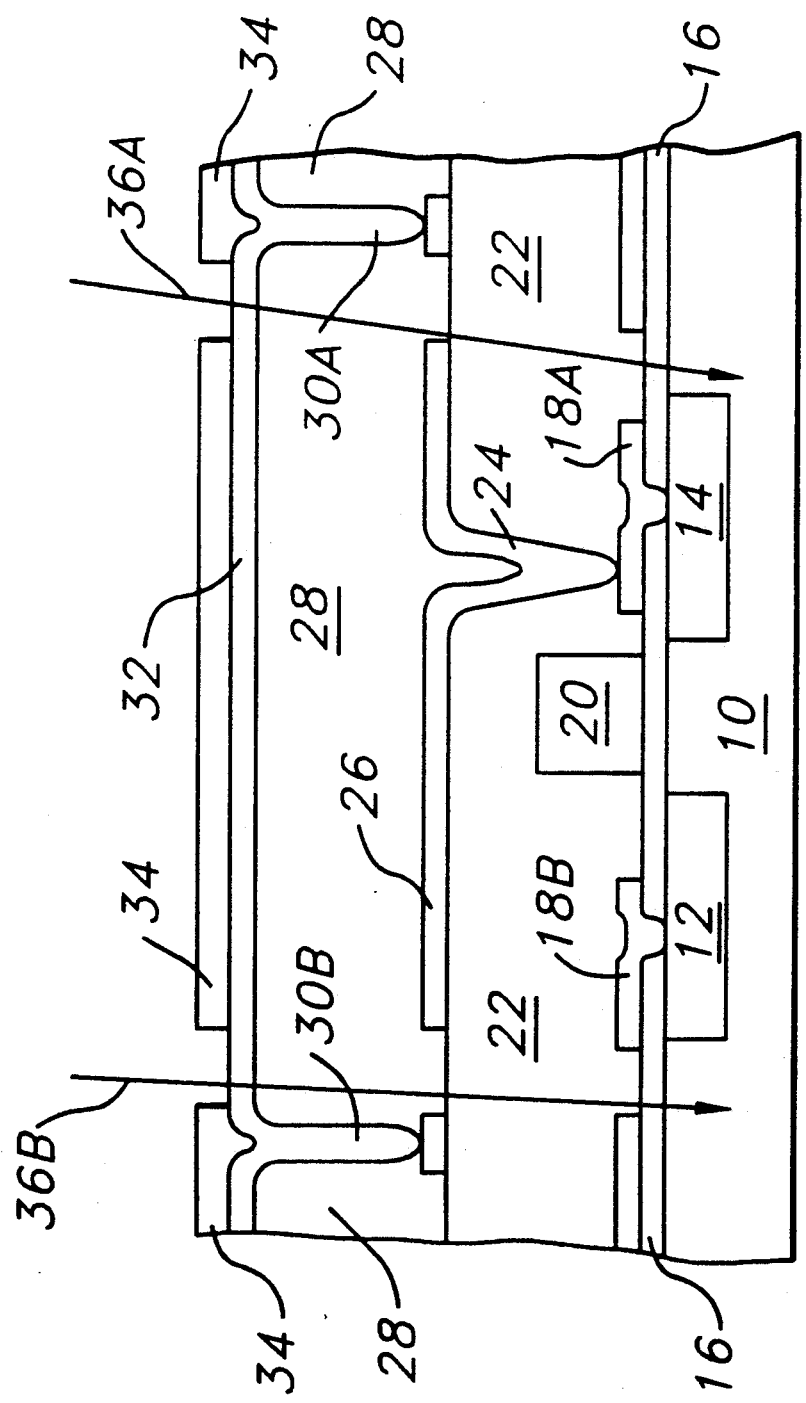
FIG. 1 shows a structure for allowing light into a substrate.

FIG. 1 shows one example of a way to control operation of an optical system. When the device is manufactured, gaps can be left in the top layer and subsequent lower layers to allow passage of light into the substrate. The example shown is of a deformable mirror device (DMD), but it is understood that such a method could be used in any spatial light modulator device.

In one embodiment, the device has transistors in the substrate 10, one of which is shown. Drain 12 and source 14 are formed in the substrate. A layer of gate oxide 16 is then laid upon them. Gate 20 is formed, normally out of polysilicon. Contact metal 18a and 18b is formed over the gate oxide. If planarization is desired, layer 22 can be deposited and etched to form a flat layer. Via 24 is etched into the planarization layer 22, normally some kind of glass such as BPSG. A metal layer is then deposited and etched. The metal fills via 24. The metal is then patterned and etched to form electrodes, one of which is 26.

To form the mirror elements in DMDs, layer 28 deposited over the electrode 26 and used as a spacer. Vias 30a and 30b are patterned into the spacer for posts. A layer of hinge metal 32 is deposited over the spacer, which fills the vias, forming the support posts, and hinges. Metal layer 34 is then deposited and etched everywhere but where the mirror elements are desired. The spacer is then etched out from underneath the mirror to leave a gap. The resultant device consists of a wide mirror element supported by thin hinges over an air gap, at the bottom of which lies an electrode.

If this device is carefully aligned during the manufacture, paths 36a and 36b will be left in the device. Light can then enter the substrate by passing around the thin hinges through the air gap and the planarization layer into the substrate. When light comes in contact with the substrate, it causes the generation of photocarriers, which in turn cause high leakage current in the transistor, and the device shuts off. The sensitivity of the device to too much light can thus be used to shut off at higher levels of illumination.

Problems with this approach exist. One possible problem is that the device must be manufactured with a certain optical path alignment. If someone were to remove the device and use it in a different optical path geometry, it is possible they could avoid this effect. Additionally, this method only limits the use of the device at high levels of illumination.

An alternative approach is shown in FIG. 2. A circuit which can be manufactured to the side of the device in question is shown. System clock 38 is assumed to be the clock driving the device, but it is possible to use any signal essential to operation of the system or device. Voltage supply 40 is connected through load transistor 42 to phototransistor 44. When the system is operating at a lower level of illumination, phototransistor 44 is off, which leaves line 46 out of the load transistor high. With line 46 high, feeding into transistor 48, transistor 48 is on, which means that the clock signal from 38 can pass to the system through line 50. When an excessive level of illumination occurs, phototransistor 44 turns on, pulling line 46 low. When line 46 is low, transistor 48 is off, and the clock signal 38 does not pass to line 50, and the device in question does not have a clock, thereby shutting off. This approach has the advantage of being optical system independent, but again does not allow control at any level more than excessive levels of illumination. It is also very easy to bypass this technique. Because the phototransistor is off when it is dark, thus having no effect, this part of the device under the window that allows in light could just be covered with something that would not allow it to be illuminated.

Another approach is shown in FIG. 3a. In this system two phototransistors are used. Any light sensitive elements that can affect the signal line passing to the logic gate can be used, such as photodiodes. One transistor, 44a, becomes active at low levels of light, referred to as the weak transistor. The other, 44b, becomes active at higher levels of light, referred to as the strong transistor. They are powered by voltage supply 40 through load transistors 42a and 42b. When the system is dark, both transistors are off. The output line 46a from the weak transistor is fed directly into a logic gate, in this embodiment an NOR gate 54. The output line 46b from the strong transistor is inverted at 52 before being fed into the NOR gate 54. The output of the gate is then connected to the clock line 38 through transistor 48.

As can be seen in the logic table of FIG. 3b, when the system is dark, both transistors are off. Lines 46a and 46b are high. But line 46b is inverted, so the two inputs to the NOR gate high and low respectively. The line between the NOR gate and the transistor 48 is then low, the clock signal does not pass, and the device will not operate.

At low level of illumination, the weak transistor comes on. This pulls the line 46a low. Line 46b is unaffected since the light is not sufficiently strong to cause transistor 44b to turn on. Two low inputs into a NOR gate result in a high signal to transistor 48. This will allow the clock signal to pass onto line 50 and out to the system.

At high levels of illumination, both transistor come on. Both lines 46a and 46b go low. This results in a high and a low into the NOR gate 54, which results in a low signal. Transistor 48 stays off and the clock does not get to the system.

The logic gate can be selected to control the operation at any window. For example, eliminating the invertor would cause the system to only operate at high levels of illumination. The window of operation can be fixed depending on which logic gate is used. The combination of inputs and possible outputs is only limited by the designer's intention for the circuit. The gate could be arranged so that it only operates when the two inputs are different, an XOR function. Or, using the NOR gate, the system can be fixed to operate only when the line from the weak transistor is high and the line from the strong one is low. If, for example, the weak transistor has failed, and the weak one stays off and the strong one turns on, the system will not operate.

The transistor 48 prevents disconnection from the control signal of the safety circuit. It is possible to burn a trace with a laser, eliminating any connection to the safety circuit. Because transistor 48 will only operate when its input line is high, this cannot be done in this case. If the line were burned through, the control signal would never pass through the transistor to the system. Instead of a single transistor, due to problems with a floating line from the cut, a logic gate, such as an AND gate could be used. This would require that the line from the safety circuit and the clock signal to be high so the clock will pass to the system.

Thus, although there has been described to this point a particular embodiment for a method to control operation of optical systems, it is not intended that such specific references be considered as limitations upon the scope of this invention except in-so-far as set forth in the following claims.

What is claimed is:

1. A method to control the operation of an optical system comprising:
   a. impinging visible light upon a spatial light modulator in said optical system from a visible light source;
   b. providing at least two light-sensitive devices with outputs as part of said devices, wherein in at least one of said light-sensitive devices is more sensitive to said visible light than other of said devices;
   c. inputting at least two said light-sensitive device outputs to a logic device; and
   d. selectively inhibiting a signal essential for operation of said spatial light modulator in response to the output of said logic device.

2. The method as in claim 1 wherein said inputting step includes inverting at least one of said at least two-light sensitive device outputs.

3. The method as in claim 1 wherein said inhibiting step includes connecting said output of said logic device to the gate of a transistor and connecting said signal to the input line of said transistor.

4. The method as in claim 1 wherein said light-sensitive devices are phototransistors.

5. The method as in claim 1 wherein said logic device is a NOR gate.

6. The method as in claim 1 wherein said logic device includes a inverter.

7. A system to control the operation of an optical system comprising:
   a. a visible light source for illuminating said optical system;
   b. a spatial light modulator for receiving said visible light;
   c. at least two light-sensitive devices adjacent said spatial light modulator, wherein at least one of said light-sensitive devices is more sensitive to light from said source than others of said devices;
   d. a logic device connected to at least two of said light-sensitive devices;
   e. circuitry connected to the output of said logic device for selectively inhibiting a signal essential for operation of said spatial light modulator as to when it can pass to said optical system.

* * * * *